United States Patent [19]
Huang et al.

[11] Patent Number: 6,114,915
[45] Date of Patent: Sep. 5, 2000

[54] PROGRAMMABLE WIDE-RANGE FREQUENCY SYNTHESIZER

[75] Inventors: Joseph Huang, San Jose; Xiaobao Wang, Santa Clara; Chiakang Sung, Milpitas; Bonnie I. Wang, Cupertino; Khai Nguyen, San Jose; Wayne Yeung, San Francisco; In Whan Kim, San Jose, all of Calif.

[73] Assignee: Altera Corporation, San Jose, Calif.

[21] Appl. No.: 09/285,180

[22] Filed: Mar. 23, 1999

Related U.S. Application Data

[60] Provisional application No. 60/107,166, Nov. 5, 1998.

[51] Int. Cl.[7] .............................. H03L 7/183; H03K 21/38
[52] U.S. Cl. ............................ 331/25; 331/1 A; 331/34; 331/45; 331/57; 377/52; 377/107
[58] Field of Search ............................... 331/1 A, 25, 34, 331/45, 57; 377/52, 107

[56] References Cited

U.S. PATENT DOCUMENTS

| | | | |
|---|---|---|---|
| 4,975,931 | 12/1990 | Cosand | 377/52 |
| 5,036,216 | 7/1991 | Hohmann et al. | 309/269 |
| 5,059,924 | 10/1991 | JenningsCheck | 331/1 A |
| 5,233,316 | 8/1993 | Yamada et al. | 331/45 |
| 5,298,867 | 3/1994 | Mestha | 328/233 |
| 5,391,996 | 2/1995 | Marz | 327/158 |
| 5,416,446 | 5/1995 | Holler, Jr. et al. | 331/57 |
| 5,488,627 | 1/1996 | Hardin et al. | 375/204 |
| 5,614,869 | 3/1997 | Bland | 331/1 A |
| 5,889,436 | 3/1999 | Yeung et al. | 331/2 |

OTHER PUBLICATIONS

ORCA OR3Cxx (5 V) and OR3Txxx (3.3 V) Series Field–Programmable Gate Arrays, Lucent Technologies, microelectronics group, Bell Labs Innovations, preliminary data sheet Nov. 1997.

*Primary Examiner*—Siegfried H. Grimm
*Attorney, Agent, or Firm*—Townsend and Townsend and Crew

[57] ABSTRACT

Method and circuitry for a frequency synthesizer having wide operating frequency range. The frequency synthesizer uses multiple programmable loadable counters in a phase-locked loop arrangement to generate any combination of clock frequencies based on user programmed values. In a specific embodiment of the invention, the phase-locked loop includes a voltage-controlled oscillator with a built-in programmable phase shift. The present invention further provides a preferred embodiment for a high speed loadable down counter for use in the frequency synthesizer.

17 Claims, 6 Drawing Sheets

PROGRAMMABLE WIDE-RANGE FREQUENCY SYNTHESIZER

CROSS-REFERENCES TO RELATED APPLICATIONS

This application is a non-provisional of Application Ser. No. 60/107,166, filed Nov. 5, 1998, the disclosure of which is incorporated herein by reference.

BACKGROUND OF THE INVENTION

The present invention relates in general to integrated circuits, and in particular to a wide-range frequency synthesizer with programmable phase shift and high speed counters.

Frequency synthesizers are commonly found in circuit applications where periodic signals (e.g., clock signals) with accurate, user programmable frequencies are required. The use of phase-locked loops (PLLs) to implement frequency synthesizes are well known. A conventional PLL includes a phase detector that compares the phase of the loop frequency with an input (or reference) frequency. The output of the phase detector is typically filtered and applied to a voltage controlled oscillator (VCO). The frequency output of the VCO changes in the direction of the input reference frequency in response to the output of the phase detector. When the two signals reach the target phase relationship, the VCO frequency is said to be locked to that of the input frequency.

One type of circuit that uses a PLL is the programmable logic device (PLD). A PLD includes a large number of programmable logic cells interconnected by a programmable array of interconnects. The logic cells typically include clocked registers to implement sequential logic. The programmable resources within a PLD are configured by the user to perform a desired logic function. It is common to find a PLL on a PLD for the purpose of generating an internal clock signal to operate the various registers. The PLL is designed to generate an internal clock that meets the setup and hold time requirements of the PLD registers. The setup and hold time requirements for the PLD registers, however, vary depending on the configuration of the PLD. That is, depending on the configuration of the PLD, the location of the registers employed and their clocking requirements vary. Therefore, to ensure proper operation of the PLD regardless of the configuration, the PLL is usually designed for the worst case setup and hold time requirements. This results in less than optimum speed of operation for many configurations that could operate with tighter setup and hold times. Thus, this exemplary application highlights the need for a PLL that is capable of generating output signals across a wide range of frequencies and with programmable phase shift.

SUMMARY OF THE INVENTION

The present invention provides methods and circuitry for a frequency synthesizer having wide operating frequency range. In one embodiment, the frequency synthesizer uses multiple programmable loadable counters in a phase-locked loop to generate any combination of clock frequency based on user programmed values. In a more specific embodiment of the invention, the phase-locked loop includes a built-in programmable phase shift. The present invention further provides a preferred embodiment for a high speed loadable down counter for use in the frequency synthesizer.

Accordingly, in one embodiment, the present invention provides a frequency synthesizer including a phase detector having a first input coupled to receive a first signal, a second input and an output; a controlled-delay oscillator (CDO) having an input coupled to the output of the phase detector, and a plurality of CDO outputs configured to supply a respective plurality of CDO signals having varying delays with respect to each other; a programmable selection circuit having a plurality of inputs respectively coupled to the plurality of CDO outputs; and a loop divider circuit coupled between the programmable selection circuit and the second input of the phase detector. The frequency synthesizer allows the user to programmably select one of the plurality of CDO signals thereby generating an output signal with programmable phase shift.

In another embodiment, the present invention provides a high speed frequency divider circuit including a loadable down counter; a next state logic coupled to the down counter; a multiplexing circuit having a first plurality of inputs respectively coupled to a plurality of outputs of the next state logic, a second plurality of inputs, and a plurality of outputs coupled to a respective plurality of inputs of the down counter; a cycle selection circuit having a plurality of outputs respectively coupled to the second plurality of inputs of the multiplexing circuit, wherein during counting the multiplexing circuit supplies the outputs of the next stage logic to the down counter, and when the down counter reaches the end of count, the multiplexing circuit supplies the outputs of the cycle selection circuit to the down counter.

In yet another embodiment, the present invention provides a method for dividing the frequency of a signal including the steps of: (a) applying the signal to a down counter; (b) storing. a first count value and a second count value in memory; (c) loading the down counter with the first count value; (d) detecting when the down counter counts to the end of the first count value; (e) toggling an output signal when the down counter reaches end of count for the first count value; (f) loading the down counter with the second count value when the down counter reaches end of count for the first count value; (g) toggling the output signal when the down counter reaches end of count for the second count value; and repeating steps (c) through (f).

The following detailed description with the accompanying diagrams provide a better understanding of the nature and advantages of the high speed wide-range frequency synthesizer according to the present invention.

DESCRIPTION OF THE SPECIFIC EMBODIMENTS

Figure 1:
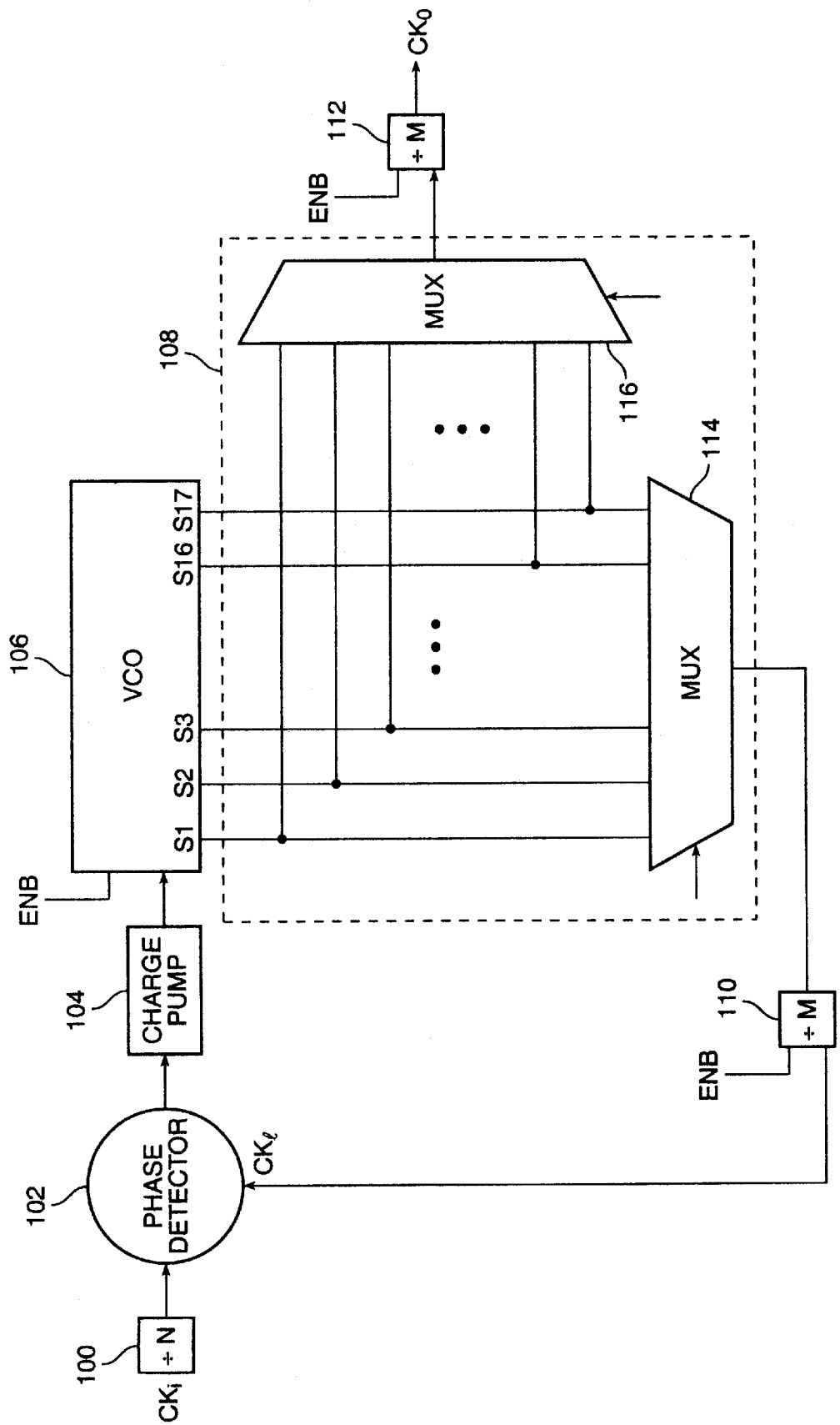
FIG. 1 is a block diagram of a preferred embodiment for the frequency synthesizer of the present invention.

FIG. 1 is a simplified block diagram for a frequency synthesizer or phase-locked loop (PLL) according to a specific embodiment of the present invention. The frequency synthesizer includes a programmable divide-by-N counter (or N counter) 100 that receives an input reference clock signal $CK_i$. The input reference clock signal $CK_i$ may be externally supplied or internally generated. N counter 100 divides the frequency of $CK_i$ by N and supplies it to one input of a phase detector 102. Phase detector 102 receives loop signal $CK_l$ at another input and drives an input of a charge pump circuit 104 with its output. A preferred embodiment for phase detector 102 is described in detail in commonly-assigned provisional patent application number 60/107,101 (Attorney Docket Number 015114-0518/A487), entitled "A Programmable N-State Phase and Frequency Detector with Fast Lock Acquisition Time and Wide Operating Frequency Range," which is hereby incorporated by reference in its entirety. The output of charge pump circuit 104 drives a controlled-delay oscillator that may be for example a voltage-controlled oscillator (VCO) 106. According to the present invention, VCO 106 is a multi-stage ring oscillator that provides predetermined phase increments at various taps. A selection or multiplexing circuit 108 receives the various VCO output taps and selectively connects one VCO output tap to a divide-by-M loop counter (or M counter) 110 and one VCO output tap to a divide-by-K output (or K counter) 112. Multiplexing circuit 108 includes a first (or M) multiplexer 114 that selectively connects a VCO output to M counter 110 and a second (or K) multiplexer 116 that selectively connects a VCO output to K counter 112. M counter 110 generates the loop signal $CK_l$ that is supplied to one input of phase detector 102, and K counter 112 generates the final output clock signal $CK_o$.

The frequency synthesizer as thus configured operates to generate any combination of output clock frequency $CK_o$ as a function of the input reference clock signal $CK_i$ as follows: $CK_o = CK_i \times [M/(N \times K)]$. Counter N is optional and in some embodiments may not be included. Counters M, N and K are programmable counters whereby the values M, N and K can be programmed by the user. K counter 112 is used to divide VCO frequency to a lower frequency. For example, VCO 106 can run at 20 MHz. If the K counter is preloaded as a divide-by-20 circuit, then the output clock frequency would be set at 1 MHz.

An important feature of the present invention is a built-in user programmable phase shift that is made possible by the combination of VCO 106 and multiplexing circuit 108. As discussed above, in the exemplary case of a PLD, the programmable phase shift as disclosed by the present invention allows the user to programmably adjust setup and hold time windows for PLD register as desired. The present invention achieves the programmable phase shift by having a multistage VCO 106 that provides predetermined phase increments at various taps. In the example shown, VCO 106 is a programmable 17-stage ring oscillator with 17 output taps S1 to S17. The various VCO output taps are multiplexed and selectively provided as inputs to K counter 112 and M counter 110. Thus, the input to K counter 112 and the input to M counter 110 can be ahead or behind each other in time providing for a fine tuning mechanism of setup and hold time windows based on user selection.

Figure 2:
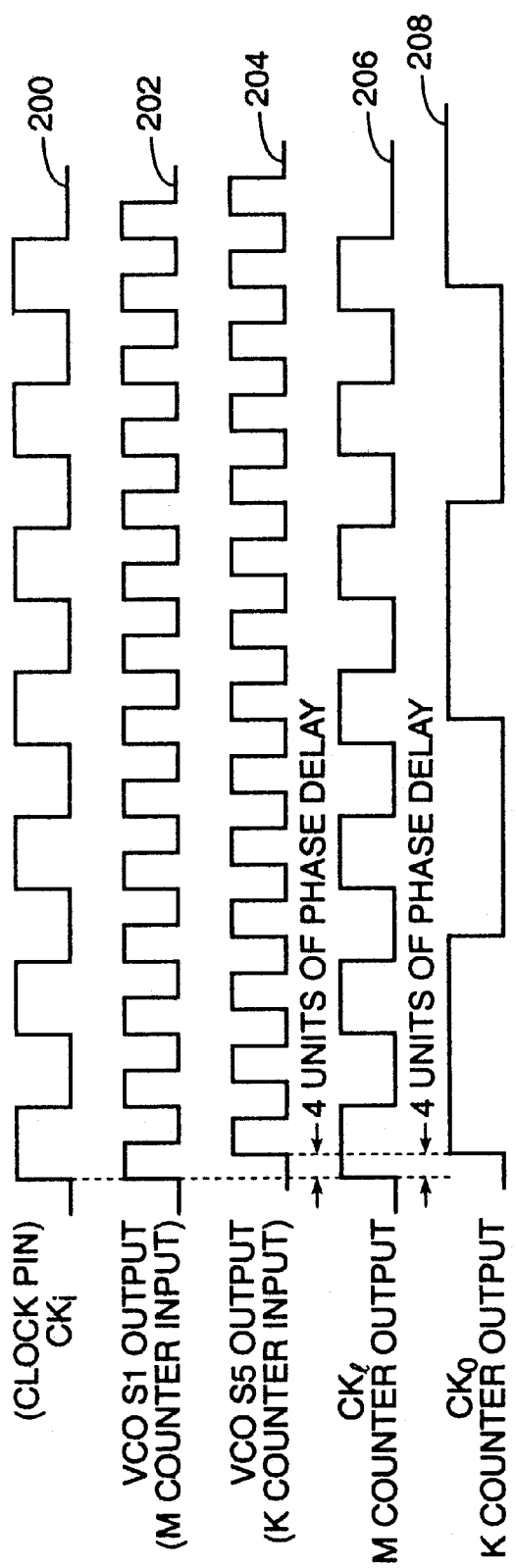
FIG. 2 is a timing diagram illustrating the operation of the programmable phase shift feature of the present invention.

FIG. 2 is a timing diagram illustrating one example of the phase relationship between M counter 110 and K counter 112. Input reference clock signal $CK_i$ is shown as signal 200, and arbitrary VCO output taps S1 and S5 are shown by signals 202 and 204. As illustrated by FIG. 2, signal 204 at VCO output tap S5 is four delay units delayed compared to signal 202 at VCO output tap S1. Supplying signal 202 to M counter 110 (via M multiplexer 114), and programming M counter 110 as a divide-by-2 circuit results in loop signal $CK_l$ as shown by signal 206. Supplying signal 204 to K counter 112 (via K multiplexer 116), and programming K counter 112 as a divide-by-4 circuit results in output signal $CK_o$ as shown by signal 208. Accordingly, a finely defined phase relationship between loop signal $CK_l$ and output signal $CK_o$ can be achieved by the circuit of the present invention.

Figure 3:
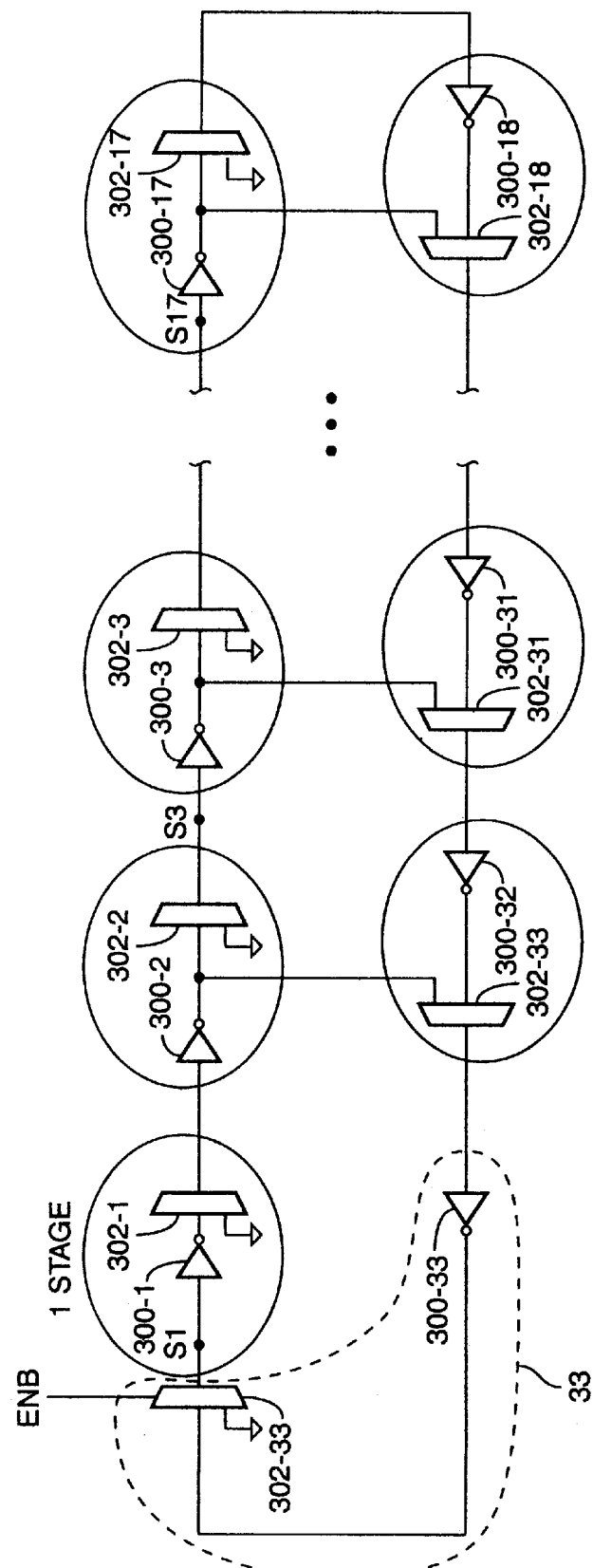
FIG. 3 shows a simplified exemplary implementation for a voltage controlled oscillator having programmable phase shift for use in the frequency synthesizer of the present invention.

Referring to FIG. 3, there is shown a simplified example of a programmable ring oscillator that is used to implement an exemplary VCO 106. In the specific example shown in FIG. 3, VCO 106 has a built-in programmable phase shift with 17 output taps S1 to S17, where the number of output taps is generally given by adding one to the total number of stages and then dividing the number by two. Thus, VCO 106 is made up of a 33-stage programmable ring oscillator. Each stage of the ring oscillator, according to the present invention, includes an inverting circuit 300 followed by a multiplexer 302. Inverting circuit 300 includes an inverter with a variable load. The variable loading in each inverting circuit is adjusted by the output of charge pump circuit 104 to control the frequency of the ring oscillator. A more detailed description of a preferred multi-sage VCO with programmable phase shift, such as the one shown in FIG. 3, is provided in commonly-assigned provisional patent application number 60/106,876 (Attorney Docket Number 15114-519/A488), entitled "A Voltage, Temperature and Process Independent Programmable Phase Shift Circuit for PLL," which is hereby incorporated by reference in its entirety.

The provision of multiplexers 302 addresses resynchronization requirements between K counter 112 and M counter 110 upon power up (or PLL reset), as well as making the number of stages of the ring oscillator programmable as described hereinafter. Because VCO 106 is implemented by a programmable ring oscillator, the resynchronization between K counter 112 and M counter 110 becomes a challenging task. This is so because upon power up, the state of the various internal nodes of the ring oscillator inside VCO 106 is unknown, making it difficult to determine the correct clock edge to be used by K counter 112. The circuit of the present invention is designed to detect the correct clock edge to be divided by K counter 112. According to a specific embodiment of the present invention shown in FIG. 3, VCO output taps can be enabled by a predefined sequence. In one example, upon power up, multiplexer 302-33 is enabled to cause output tap S1 transition from low to high first. This is followed by S3 going from low to high with a fixed amount of phase delay (two stages), then S5, S7, and so on until S17 goes from low to high. The transition by S17 from low to high causes S1 to go from high to low and the circuit begins oscillating. Thus, upon power up, the ability to force an output tap (e.g., S1 via multiplexer 302-33) to a known state, ensures that K counter 112 is clocked with the right clock edge. M counter 110 does not have the same problem because the correct clock edge can be detected by the phase detector and compared to the reference clock. Thus, according to the present invention, the VCO oscillates with a predefined phase sequence relative to the K and M counter inputs, instead of a random clock sequence.

As can be seen from FIG. 3, not every multiplexer 302 receives an enable signal (ENB). It is critical to maintain the same delay per stage in the ring oscillator. Thus, a multiplexer 302 is added to every stage to replicate the loading conditions per stage. Accordingly, many multiplexers 302 do not perform any function other than replicating the loading and are thus essentially dummy circuits. For example, multiplexers 302-1, 302-2, 302-3 and 302-17 are among the dummy multiplexers. Other multiplexers 302 provide for the additional functionality of programmability of the number of stages of the ring oscillator. Multiplexer 302-32, for example, can be programmed to either pass the output of the third-second stage of the ring oscillator or the output of the second stage. All of multiplexers 302-18 through 302-32 can be made programmable in a similar fashion to provide for full programmability of the number of stages of the ring oscillator.

Figure 4:
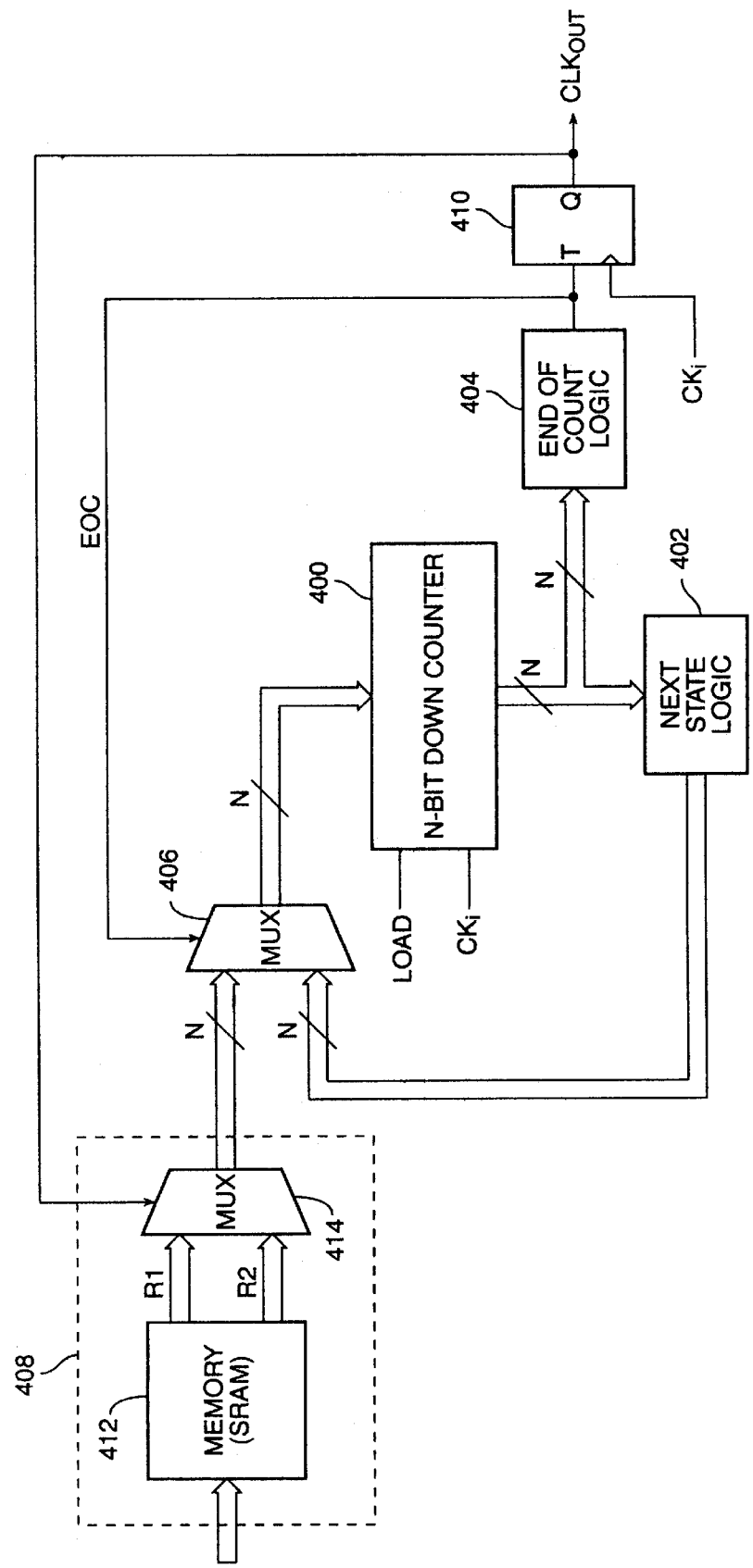
FIG. 4 is a block diagram for an exemplary implementation for a programmable loadable counter for use in the frequency synthesizer of the present invention.

A critical aspect of the frequency synthesizer of the present invention is the performance of the divider circuits (N, M, and K). The speed at which these counters operate is a major factor in determining the limit on the output frequencies. Referring now to FIG. 4, there is shown an exemplary implementation for a high speed counter for use in the frequency synthesizer of the present invention. The high speed counter includes an N-bit loadable down counter 400 that has an N-bit load input and an N-bit count output. The N-bit count output of down counter 400 is applied to a next state logic 402 and an end of count logic 404. The N-bit output of next state logic 402 connects to a first N-bit input of a multiplexer (MUX) 406. The second N-bit input of MUX 406 receives an N-bit signal from a cycle selection circuit 408. MUX 406 receives the output of end of count logic 404 (EOC) at its control input. The output signal EOC of end of count logic 404 also feeds into an input of a final flip flop 410 (e.g., of toggle type). Output of flip flop 410 provides the counter output $CLK_{out}$ which is also fed back to an input of cycle selection circuit 408.

The operation of high speed counter of FIG. 4 is as follows. Upon reset, down counter 400 is loaded with an N-bit value R1 supplied by cycle selection circuit 408 via MUX 406. The value R1 is programmed by the user and is stored inside cycle selection circuit 408. In an exemplary embodiment where the PLL is employed inside a PLD, cycle selection circuit 408 includes PLD configuration random access memory (RAM) cells 412 that store the value R1. The value R1 determines the number of cycles the output clock $CLK_{out}$ will be in a logic high state. Thus, for as long as down counter 400 is counting from R1 down to the end of count, the output $CLK_{out}$ remains at its high state. When down counter 400 starts counting and during the count, the signal EOC selects the output of next state logic 402 to be fed into down counter input via MUX 406. When end of count logic 404 detects the end of count, output clock $CLK_{out}$ transitions to a logic low state, and the EOC signal controls MUX 406 to once again load the output of cycle selection circuit 408 into down counter 400. This time a value R2 supplied by cycle selection circuit 408 is loaded into down counter 400 when it resets. In the exemplary embodiment shown, cycle selection circuit 408 further includes a multiplexer 414 that receives R1 and R2 values from memory 412 and selects one based on the $CLK_{out}$ signal. The value of R2 determines the number of cycles output clock $CLK_{out}$ will be in a logic low state. Thus, by adjusting the values R1 and R2 the user can program not only the divide ratio of the circuit but the duty cycle of the output signal $CLK_{out}$.

Figure 5:
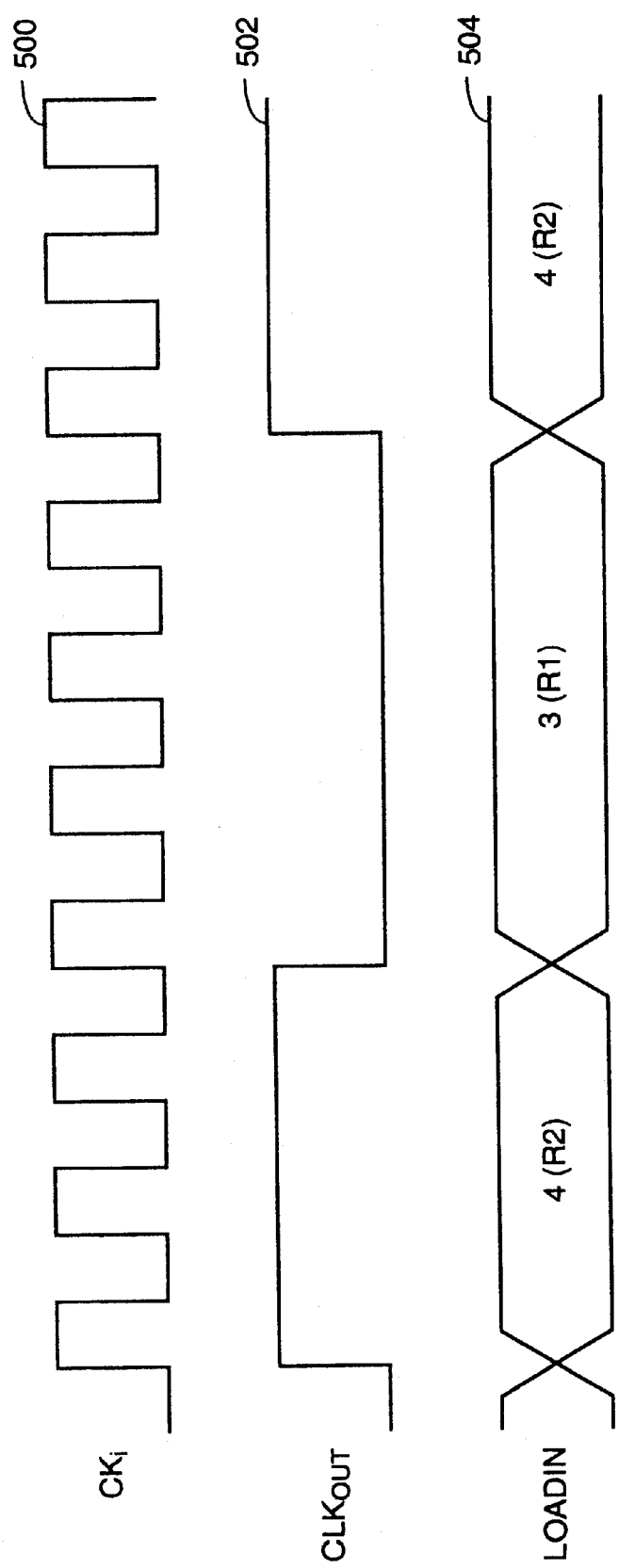
FIG. 5 is a timing diagram illustrating the operation of the programmable loadable counter of FIG. 4.

FIG. 5 is a timing diagram illustrating the operation of the programmable loadable counter of FIG. 4 for an exemplary divide-by-7 circuit. For a divide-by-7 function, R1 would be set to three and R2 would be set to four. Signal 500 is the reference clock $CK_i$ that is supplied to down counter 400 and output flip flop 410. Down counter 400 is thus initialized so that R1=3 is first loaded into the counter at the next edge of the reference clock $CK_i$. Signal 502 is the output clock $CLK_{out}$ that as shown is at a high state for three counts of $CK_i$ signal in response to an initial loading of R1=3. While counter 400 counts down, the value R2=4 is prepared for loading into counter 400 such that for the next cycle, signal $CLK_{out}$ transitions low and remains low for four counts of the $CK_i$ signal. Signal 504 indicates when the next R value is loaded into counter 400. Note that R2 is the value for the next state, and is thus ready before end of count is reached.

The counter being configured as such (frequency divider) results in an output clock $CLK_{out}$ having a frequency that is always lower than the frequency of the reference clock $CK_i$. This ensures that the output of cycle selection circuit 408 is ready when down counter 400 resets. By combining the use of memory to store values R1 and R2 with a down counter, the speed of the counter is appreciably enhanced. The speed of the counter, according to this embodiment of the present invention, is determined by the delay of the registers inside counter 400 plus the delay of the feedback path back to input of counter. Accordingly, unlike conventional ripple counters, the loadable down counter of the present invention operates without the need to ripple a carry signal, and can therefore operate at higher frequencies. Further, implementing the divider circuit by a down counter as opposed to an up counter simplifies the end of count decoding (performed by end of count logic 404), as the end of count is always the same. The counter can be of any length desired by the user. In an alternative embodiment, the counter of the present invention can be implemented using only one preset value R1 which reduces the amount of memory required, but eliminates the user programmability of the counter output duty cycle. Additional circuitry would then be required for duty cycle adjustment.

Figure 6:
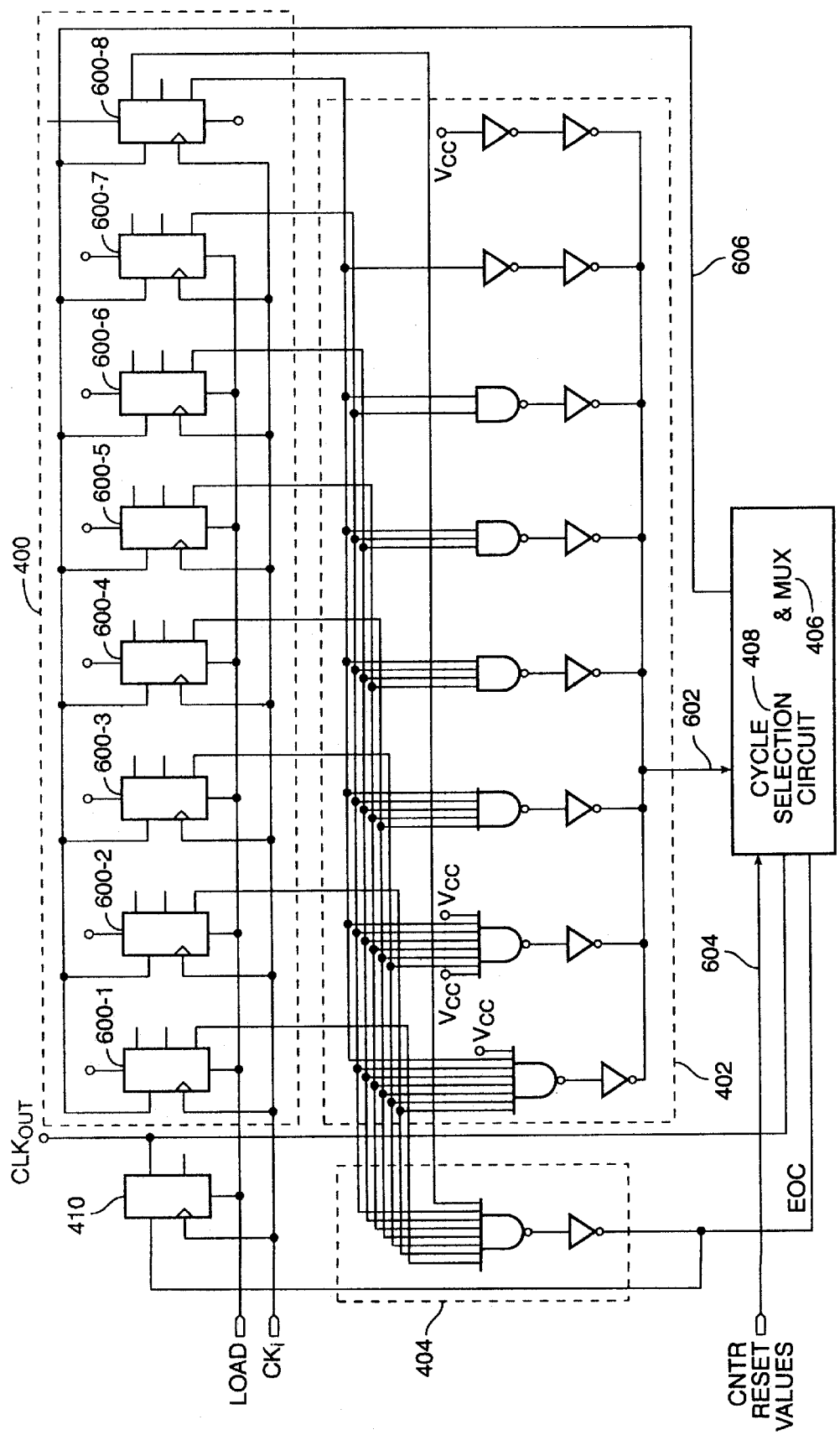
FIG. 6 shows a more detailed exemplary circuit implementation for the high speed loadable counter.

FIG. 6 shows an exemplary circuit implementation for the high speed counter of FIG. 4. The same reference numerals are used herein to refer to the same functional blocks in both figures. The exemplary implementation uses an 8 bit counter with down counter 400 including eight registers 600. Next stage logic 402 is made up of inverters and NAND gates that perform per bit decoding of the counter outputs. End of count logic 404 is implemented by a simple 8-bit AND gate (NAND followed by an inverter). Cycle selection circuit 408 and MUX 406 are shown as one block that receives an 8-bit bus 602 that carries the output of next state logic 402, and a 16-bit bus 604 that supplies the counter reset values R1 and R2. In embodiments with only one reset value, bus 604 would be 8-bit wide. This block also receives the EOC signal from end of count logic 404 to control MUX 406 as well as the output signal $CLK_{out}$ to switch from R1 to R2. Cycle selection circuit 408 and MUX 406 can be implemented using conventional SRAM cells to store the reset values R1 and R2, and CMOS transmission gates to perform the multiplexing function.

In conclusion, the present invention provides a frequency synthesizer having wide operating frequency range. The frequency synthesizer uses multiple high speed programmable loadable counters in a phase-locked loop to generate any combination of clock frequency based on user programmed values. The PLL includes a VCO with built-in programmable phase shift. High speed counters are implemented by a combination of memory to store reset value and a down counter. While the above is a complete description of specific embodiments of the present invention, it is possible to use various alternatives, modifications and equivalents. For example, the frequency of controlled-delay oscillator may be current-controlled as opposed to voltage-controlled, or may be implemented by different types of frequency control circuitry. Therefore, the scope of the present invention should be determined not with reference to the above description but should, instead, be determined with reference to the appended claims, along with their full scope of equivalents.

What is claimed is:

1. A frequency synthesizer comprising:
 a phase detector having a first input coupled to receive an input signal, a second input and an output;
 a controlled-delay oscillator (CDO) having an input coupled to the output of the phase detector, and a plurality of CDO outputs configured to supply a respective plurality of CDO signals having varying delays with respect to each other;
 a programmable selection circuit having a plurality of inputs respectively coupled to the plurality of CDO outputs;
 a loop frequency divider having an input coupled to receive a first selected CDO signal, and an output coupled to the second input of the phase detector; and
 an output frequency divider having an input coupled to receive a second selected CDO signal, and an output coupled to carry an output signal.

2. The frequency synthesizer of claim 1 wherein the programmable selection circuit comprises:
 a first multiplexer having a plurality of inputs respectively coupled to the plurality of CDO outputs, a control input, and an output coupled to the input of the loop frequency divider; and
 a second multiplexer having a plurality of inputs respectively coupled to the plurality of CDO output, a control input, and an output coupled to the input of the output frequency divider.

3. The frequency synthesizer of claim 2 wherein the controlled-delay oscillator comprises a voltage-controlled oscillator.

4. The frequency synthesizer of claim 3 wherein the voltage-controlled oscillator comprises a ring oscillator having a plurality of inverting stages coupled in a ring, and wherein each inverting stage comprises:
 an inverting circuit with a voltage-controlled variable load; and
 a multiplexer having a first input coupled to an output of the inverting circuit, a second input, and an output coupled to an input of a next inverting stage.

5. The frequency synthesizer of claim 4 wherein the multiplexer in a selected one of the inverting stages has its second input coupled to a reference voltage with a known logic state, and wherein the multiplexer in the selected one of the inverting stages further comprises an enable input.

6. The frequency synthesizer of claim 5 wherein the reference voltage with a known logic state comprises ground.

7. The frequency synthesizer of claim 5 wherein multiplexers in a selected plurality of the inverting stages have their second input respectively coupled to a selected output of another inverting stage.

8. The frequency synthesizer of claim 4 further comprising a charge pump circuit having an input coupled to the output of the phase detector, and an output coupled to a voltage control input of the voltage-controlled oscillator.

9. The frequency synthesizer of claim 8 further comprising an input frequency divider having an input coupled to receive a reference signal having a reference frequency, and an output coupled to the first input of the phase detector carrying the input signal.

10. The frequency synthesizer of claim 1 wherein each of the loop frequency divider and the output frequency divider comprises a loadable down counter that receives the signal at the input of the divider as a clock signal, and alternatingly counts down between a first count value and a second count value.

11. The frequency synthesizer of claim 10 wherein each of the loop frequency divider and the output frequency divider further comprises:
 memory circuit configured to store the first count value and the second count value; and
 a multiplexer coupled between the memory circuit and the down counter for coupling either one of the first count value or the second count value to the down counter.

12. A frequency divider circuit comprising:
 a loadable down counter;
 next state logic coupled to the down counter;
 a multiplexing circuit having a first plurality of inputs respectively coupled to a plurality of outputs of the next state logic, a second plurality of inputs, and a plurality of outputs coupled to a respective plurality of inputs of the down counter; and
 a cycle selection circuit having a plurality of outputs respectively coupled to the second plurality of inputs of the multiplexing circuit,
 wherein, during counting by the down counter, the multiplexing circuit supplies the outputs of the next stage logic to the down counter, and when the down counter reaches the end of count, the multiplexing circuit supplies the outputs of the cycle selection circuit to the down counter.

13. The frequency divider circuit of claim 12 further comprising end of count logic having a plurality of inputs respectively coupled to the plurality of outputs of the down counter, and an output coupled to a select input of the multiplexing circuit.

14. The frequency divider circuit of claim 13 further comprising an output flip flop having an input coupled to the output of the end of count logic and an output coupled to the cycle selection circuit.

15. The frequency divider circuit of claim 14 wherein the cycle selection circuit comprises memory circuit configured to store a count value to be supplied to the multiplexing circuit when the down counter reaches end of count.

16. The frequency divider circuit of claim 15 wherein the memory circuit in the cycle selection circuit stores first and second count values, and wherein the cycle selection circuit further comprises a multiplexer configured to receive the first and the second count values as inputs and the output of the flip flop as control input.

17. A method for dividing the frequency of a signal comprising the steps of:
 (a) applying the signal to a down counter;
 (b) storing a first count value and a second count value in memory;
 (c) loading the down counter with the first count value;
 (d) detecting when the down counter counts to the end of the first count value;
 (e) toggling an output signal when the down counter reaches end of count for the first count value;
 (f) loading the down counter with the second count value when the down counter reaches end of count for the first count value;
 (g) toggling the output signal when the down counter reaches end of count for the second count value; and
 (h) repeating steps (c) through (f).

* * * * *